(12) United States Patent
Lee et al.

(10) Patent No.: US 11,302,636 B2
(45) Date of Patent: Apr. 12, 2022

(54) SEMICONDUCTOR DEVICE AND MANUFACTURING METHOD OF THE SAME

(71) Applicant: Samsung Electronics Co., Ltd., Suwon-si (KR)

(72) Inventors: Seungyoung Lee, Seoul (KR); Sanghoon Baek, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 16/946,491

(22) Filed: Jun. 24, 2020

(65) Prior Publication Data

US 2021/0104463 A1 Apr. 8, 2021

(30) Foreign Application Priority Data

Oct. 8, 2019 (KR) .................. 10-2019-0124784

(51) Int. Cl.
   *H01L 23/528* (2006.01)
   *H01L 23/522* (2006.01)
   *G06F 30/392* (2020.01)
   *G06F 30/3953* (2020.01)

(52) U.S. Cl.
   CPC ........ *H01L 23/5283* (2013.01); *G06F 30/392* (2020.01); *G06F 30/3953* (2020.01); *H01L 23/5226* (2013.01)

(58) Field of Classification Search
   CPC .............. H01L 23/5283; H01L 23/5226; G06F 30/392; G06F 30/3953
   USPC ........................................................ 257/401
   See application file for complete search history.

(56) References Cited

U.S. PATENT DOCUMENTS

| 8,612,914 | B2 | 12/2013 | Sherlekar et al. |
| 9,519,745 | B2 | 12/2016 | Yuan et al. |
| 9,536,035 | B2 | 1/2017 | Yuan et al. |
| 9,646,960 | B2 | 5/2017 | Baek et al. |
| 9,773,772 | B2 * | 9/2017 | Lee .................. H01L 27/0207 |
| 2016/0300826 | A1 | 10/2016 | Lee et al. |

(Continued)

FOREIGN PATENT DOCUMENTS

| JP | 2006331006 | 12/2006 |
| JP | 2007066974 | 3/2007 |

*Primary Examiner* — Tu-Tu V Ho
(74) *Attorney, Agent, or Firm* — Myers Bigel, P.A.

(57) ABSTRACT

A semiconductor device includes: a device layer including first and second active patterns, extending in a first direction on a substrate and adjacent to each other, and a plurality of gate electrodes extending in a second direction, intersecting the first direction, on the substrate and crossing the first and second active patterns; a lower wiring layer on the device layer, and including first and second lower wiring patterns extending in the first direction, located on the first and second active patterns, respectively, and connected to the plurality of gate electrodes; and an upper wiring layer on the lower wiring layer, and having first and second upper vias on the first and second lower wiring patterns, respectively, and first and second upper wiring patterns extending in the second direction. The first upper wiring pattern is connected to the first upper via without being connected to the second upper via and the second upper wiring pattern is connected to the second upper via without being connected to the first upper via.

17 Claims, 14 Drawing Sheets

(56) References Cited

U.S. PATENT DOCUMENTS

2018/0068907 A1 3/2018 Kim et al.
2019/0065650 A1 2/2019 Pelloie

* cited by examiner

SEMICONDUCTOR DEVICE AND MANUFACTURING METHOD OF THE SAME

CROSS-REFERENCE TO RELATED APPLICATION

This application claims the benefit of priority to Korean Patent Application No. 10-2019-0124784 filed on Oct. 8, 2019 in the Korean Intellectual Property Office, the disclosure of which is incorporated herein by reference in its entirety.

BACKGROUND

1. Field

The present disclosure relates to semiconductor devices and methods of manufacturing the same.

2. Description of Related Art

As semiconductor fabrication process technology has evolved, a height of a standard cell constituting a semiconductor device has been reduced, and a distance between adjacent patterns (for example, a pitch of gate electrodes) has also been reduced. As a result, the design rule has increased in complexity. Increasing integration may complicate a routing process used for layout design, especially for wiring layer design.

SUMMARY

Example embodiments provide a semiconductor device having a structure capable of performing complex wiring layer design with improved efficiency.

Example embodiments provide a method of manufacturing a semiconductor device capable of performing complex wiring layer design with improved efficiency.

According to an example embodiment, a semiconductor device includes: a device layer including first and second active patterns, extending in a first direction on a substrate and adjacent to each other, and a plurality of gate electrodes extending in a second direction, intersecting the first direction, on the substrate and crossing the first and second active patterns; a lower wiring layer on the device layer, and including first and second lower wiring patterns extending in the first direction, located on the first and second active patterns, respectively, and connected to the plurality of gate electrodes; and an upper wiring layer on the lower wiring layer, and having first and second upper vias on the first and second lower wiring patterns, respectively, and first and second upper wiring patterns extending in the second direction. The first upper wiring pattern is connected to the first upper via without being connected to the second upper via, and the second upper wiring pattern is connected to the second upper via without being connected to the first upper via.

According to an example embodiment, a semiconductor device includes: first and second active patterns extending in a first direction on a substrate, and adjacent to each other; a plurality of first and second gate electrodes crossing the first and second active patterns and extending in a second direction, intersecting the first direction; an interlayer insulating film on the first and second active patterns and the plurality of first and second gate electrodes; first and second lower wiring patterns extending in the first direction on the interlayer insulating film, each being connected to the plurality of first and second gate electrodes; a dielectric film on the interlayer insulating film and the first and second lower wiring patterns; a plurality of first and second upper vias in the dielectric film and connected to the first and second lower wiring patterns, respectively; a plurality of first upper wiring patterns extending in the first direction on the dielectric film, each of the plurality of first upper wiring patterns being connected to the plurality of first upper vias without being connected to the plurality of second upper vias; and a plurality of second upper wiring patterns extending in the second direction on the dielectric film, each of the plurality of second upper wiring patterns being connected to the plurality of second upper vias without being connected to the plurality of first upper vias.

According to an example embodiment, a semiconductor device includes: a plurality of cells on a substrate, and at least one cell of the plurality of cells includes: first and second active patterns having different conductivity types and extending in a first direction; a plurality of gate electrodes crossing the first and second active patterns and extending in a second direction, intersecting the first direction; first and second lower wiring patterns on the plurality of gate electrodes and configured to apply an electrical signal to the plurality of gate electrodes; first and second upper vias on the first and second lower metal wirings and connected to the first and second lower wiring patterns, respectively; and a plurality of upper wiring patterns on the first and second lower metal wirings, the plurality of upper wiring patterns include input wiring patterns connected to a first one of the first and second upper vias without being connected to a second one of the first and second upper vias.

According to an example embodiment, a method of manufacturing a semiconductor device includes: constructing a layout of an integrated circuit including a standard cell layout; manufacturing a photomask using the layout; and forming metal wires and vias vertically connecting the metal wires on a substrate, using the photomask. Constructing the layout includes: placing standard cells according to pieces of design data defining an integrated circuit, wherein at least one standard cell of the standard cells includes first and second active patterns extending in a first direction and adjacent to each other and a plurality of gate electrodes extending in a second direction, intersecting the first direction, and crossing the first and second active patterns. Constructing the layout further includes routing first and second lower wiring patterns connected to the plurality of gate electrodes in the at least one standard cell to the first and second lower wiring patterns having a plurality of available pin regions, the plurality of available pin regions being provided with pin regions overlapping in the second direction, predefining only a single pin region of pin regions overlapping in the second direction, and placing an upper via in the predesignated pin region, and routing an upper wiring pattern connected to the upper via and extending in the second direction.

BRIEF DESCRIPTION OF DRAWINGS

The above and other aspects, features and other advantages of the present disclosure will be more clearly understood from the following detailed description, taken in conjunction with the accompanying drawings, in which.

DETAILED DESCRIPTION

Figure 1:
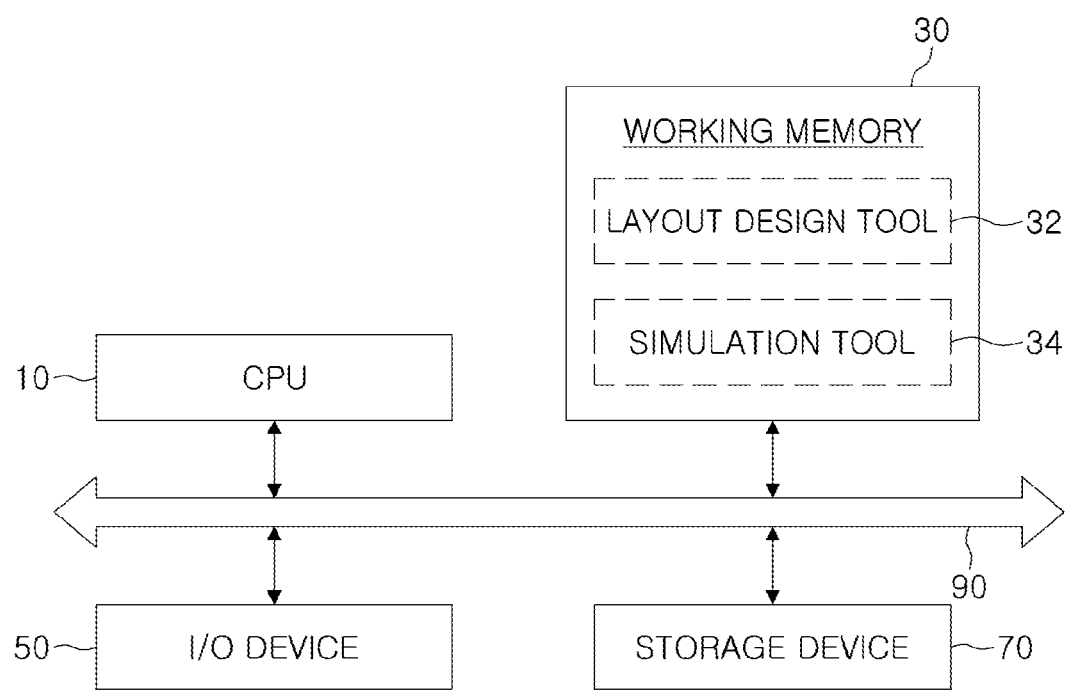
FIG. 1 is a block diagram illustrating a computer system for performing semiconductor design according to some example embodiments of the inventive concept.

Hereinafter, the exemplary embodiments of the present inventive concept will be described in detail with reference to the attached drawings. The same reference numerals of the same reference designators may denote the same elements or components throughout the specification. As used herein, the term "and/or" includes any and all combinations of one or more of the associated listed items. It will be understood that when an element is referred to as being "on," "attached" to, "connected" to, "coupled" with, "contacting," etc., another element, it can be directly on, attached to, connected to, coupled with or contacting the other element or intervening elements may also be present. In contrast, when an element is referred to as being, for example, "directly on," "directly attached" to, "directly connected" to, "directly coupled" with or "directly contacting" another element, there are no intervening elements present. It is noted that aspects described with respect to one embodiment may be incorporated in different embodiments although not specifically described relative thereto. That is, all embodiments and/or features of any embodiments can be combined in any way and/or combination.

FIG. 1 is a block diagram illustrating a computer system for performing semiconductor design according to some example embodiments of the inventive concept.

Referring to FIG. 1, a computer system may include a CPU 10, a working memory 30, an I/O device 50, and a storage device 70. The computer system may be a device configured to perform layout design according to some embodiments of the inventive concept. The computer system may in some embodiments be equipped with various design and verification simulation programs.

The CPU 10 may be configured to execute computer readable program code (e.g., an application program, an operating system, and device drivers) stored in the working memory 30 and/or storage device 70. The CPU 10 may be configured to execute an operating system (OS) loaded in the working memory 30. The CPU 10 may be configured to execute various application programs (APs), which may be managed based on the OS. For example, the CPU 10 may be configured to execute a layout design tool 32 loaded in the working memory 30.

The operating system or the application programs may be loaded into the working memory 30. When a computer system is booted, an OS image, stored in the storage device 70, may be loaded into the working memory 30 based on a boot sequence. Various input/output operations of the computer system may be supported by the operating system. In a similar manner, the application programs may be loaded into the working memory 30 by selection of a user or to provide a basic service. The layout design tool 32 for layout design according to some example embodiments of the inventive concept may also be loaded from the storage device 70 into the working memory 30.

The layout design tool 32 may have a biasing function, which may be configured to change the shape and position of specific layout patterns differently from those defined by design rules. In addition, the layout design tool 32 may be configured to perform a design rule check (DRC) in the changed biasing data condition (e.g. the changed shapes and/or positions of layout patterns). The working memory 30 may be a volatile memory, such as a static random access memory (SRAM) or a dynamic random access memory (DRAM), or a nonvolatile memory, such as a PRAM, MRAM, ReRAM, FRAM, or NOR flash memory.

The working memory 30 may further include a simulation tool 34 configured to perform optical proximity correction (OPC) for the designed layout data.

The I/O device 50 may control user input and output from user interface devices. For example, the I/O device 50 may include a keyboard or a monitor to receive information from a designer. By using the I/O device 50, a designer may receive information on a semiconductor region or data paths that may require adjusted operating characteristics. In addition, a process and a process result of the simulation tool 34 may be displayed through the I/O device 50.

The storage device 70 may be provided as a storage medium of a computer system. The storage device 70 may store applications, an operating system image, and various types of data. The storage device 70 may be provided as a memory card (for example. MMC, eMMC, SD, MicroSD, or the like) or a hard disk drive (HDD). The storage device 70 may include a NAND-type Flash memory with large storage capacity. In other embodiments, the storage device 70 may include a next generation nonvolatile memory, such as PRAM, MRAM, ReRAM, FRAM, or the like, or a NOR flash memory.

The system interconnector 90 may be a system bus for providing a network inside a computer system. The CPU 10, the working memory 30, the I/O device 50, and the storage device 70 may be electrically connected to each other and exchange data through the system interconnector 90. However, a configuration of the system interconnector 90 is not limited to the above description of example embodiments, and may further include arbitration devices for effective management.

Figure 2:
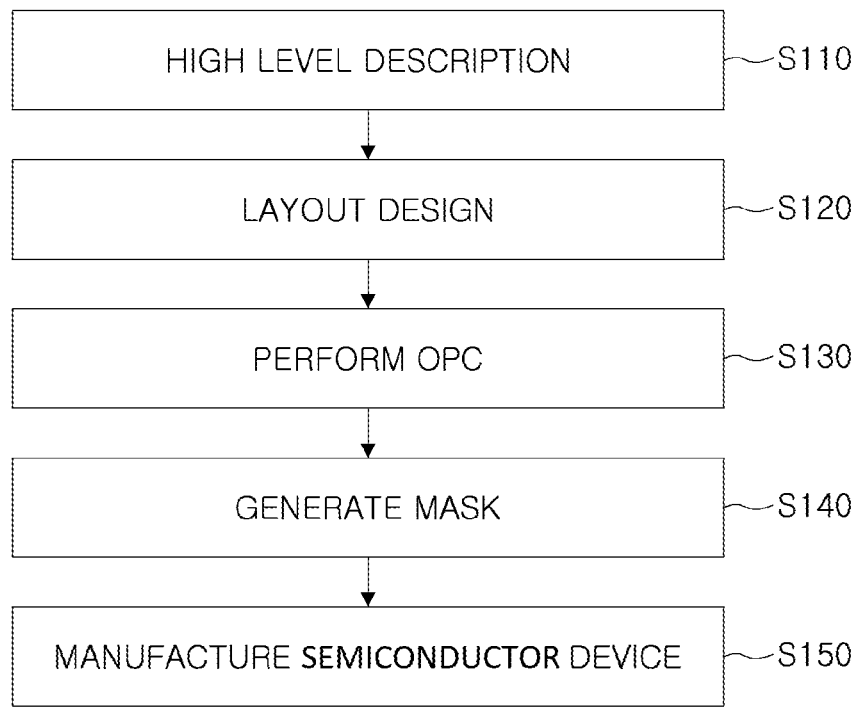
FIG. 2 is a flow chart illustrating a method of manufacturing a semiconductor device according to some example embodiments of the inventive concept.

FIG. 2 is a flow chart illustrating a method of manufacturing a semiconductor device according to some example embodiments of the inventive concept.

Referring to FIG. 2, the computer system of FIG. 1 is used to perform high level design of a semiconductor integrated circuit (S110).

The high level design may in some embodiments comprise describing a design target integrated circuit in a high level language of a computer language. For example, a high level language, such as the C programming language may be used. The circuits, designed by a high level design, may be represented more specifically by register transfer level (RTL) coding or simulation. For example, code, generated by the register transfer level coding, may be converted into a netlist and synthesized into an entire semiconductor device. The synthesized schematic circuit may be verified by a simulation tool, and may be accompanied by an adjustment process according to a verification result.

Then, layout design to implement a logically completed semiconductor integrated circuit on a silicon substrate may be performed (S120).

As described above, the layout design may be performed with reference to the schematic circuit synthesized in a high level design or a corresponding netlist. The layout design may include a routing procedure of placing and connecting various standard cells provided in a cell library according to the defined design rule.

The cell library for the layout design may also include information on the operation, speed, and power consumption of a standard cell. The cell library for representing a circuit at a specific gate level into a layout may be defined in some layout design tools.

The layout design may include a procedure of defining a shape or a size of a pattern for forming a transistor and metal wires (for example, a lower wiring layer and an upper wiring layer) to be formed on a silicon substrate. For example, to form an inverter circuit on a silicon substrate, layout patterns, such as a PMOS, NMOS, N-WELL, gate electrode, and metal wires to be formed thereon may be placed appropriately.

To this end, inverters already defined in a cell library may be searched for an appropriate inverter and the appropriate inverter may be selected. In addition, routing may be performed on the selected and placed standard cells. Some of this series of processes may be performed automatically or manually by a layout design tool. In some embodiments, placing and routing of standard cells may be automatically performed using a separate place and routing (place & routing) tool.

After the routing, verification of a layout may be performed to determine whether there is a portion violating a design rule. Items to be verified may include a design rule check (DRC), verifying that the layout is correct for a design rule, an electrical rule check (ERC), verifying that it is properly performed without disconnection inside, and a layout versus schematic (LVS), verifying that a layout matches a gate-level netlist.

During the layout design of a semiconductor device according to some example embodiments of the inventive concept, a cell library may be used, and, in the cell library, one pin metal among possible pin metals is defined in advance when positions of the pin metals (also referred to as an "upper via"), selectable in one direction within a standard cell, overlap.

Through predesignation of the pin metal, the design complexity may be improved and the running time may be reduced, while the block level scaling may also be improved. Thus, when a highly integrated memory is designed, the layout design tool 32 and/or the simulation tool 34 may be advantageously applied to a cell with high routing complexity. This will be described in detail with reference to FIGS. 3 and 4A to 4C.

Returning to FIG. 2, an optical proximity correction (OPC) procedure may be performed (S130). A photolithography process may be used so layout patterns, obtained through the layout design, may be implemented on a silicon substrate. In this example, the optical proximity correction may be a technique for correcting distortion which may occur in the photolithography process. That is, through the optical proximity correction, during exposure using the laid-out pattern, a distortion phenomenon, such as refraction or a process effect caused by the characteristics of light, may be corrected. While the optical proximity correction is performed, a shape and a position of the designed layout patterns may be changed slightly.

In the layout design according to some example embodiments, pin metals, overlapping in one direction, are predesignated, so the additional running time may not be generated for changing a position of adjacent pin metals in an optical proximity correction process.

Then, based on the layout changed by the optical proximity correction, a photomask may be manufactured (S140). For example, the photomask may be manufactured in a manner of describing layout patterns using a chromium thin film coated on a glass substrate.

The manufactured photomask may be used to manufacture a semiconductor device (S150).

In a process of manufacturing a semiconductor device using a photomask, exposure and etching processes may be repeated in various ways. Through those processes, patterns of various shapes may be sequentially formed on a silicon substrate during the layout design. In some embodiments, various semiconductor processes are performed on a semiconductor device, such as a wafer, using a plurality of masks to form a semiconductor device in which an integrated circuit is implemented. For example, a process using a mask may refer to a patterning process as part of a lithography process. Through this patterning process, a desired pattern may be formed on a semiconductor substrate or a material layer.

A semiconductor process may further include a deposition process, an etching process, an ion implantation process, a cleaning process, and the like. In addition, the semiconductor process may include a packaging process of mounting a semiconductor device on a PCB and sealing the semiconductor device with a sealing material, and may include a test process for a semiconductor device or a package thereof.

Figure 3:
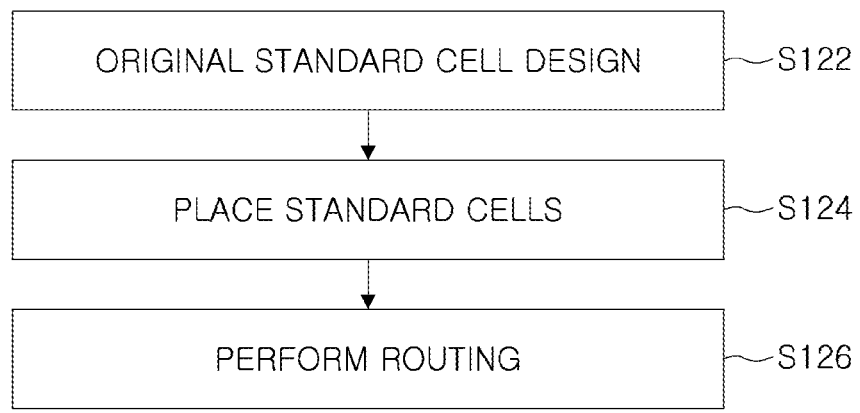
FIG. 3 is a flow chart illustrating a layout design method according to some example embodiments of the inventive concept.
Figure 4A:
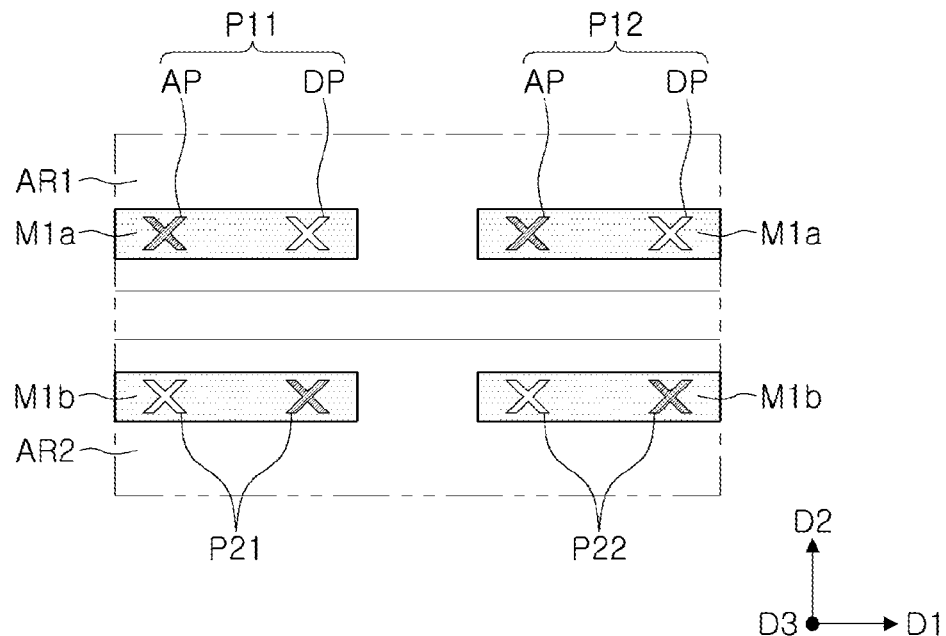
FIGS. 4A to 4C are schematic layouts illustrating a routing process of a semiconductor device according to some example embodiments of the inventive concept.
Figure 4B:
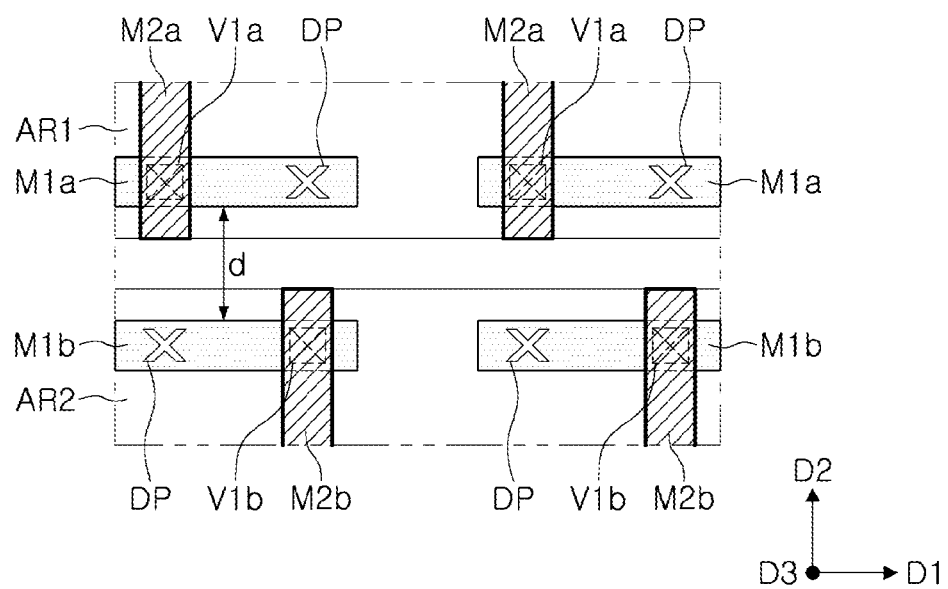
Figure 4C:
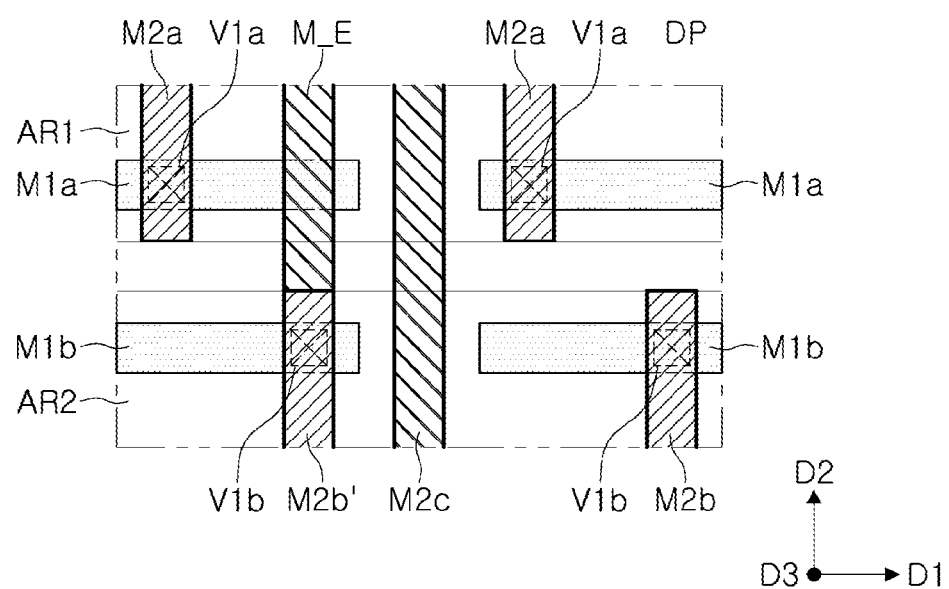

FIG. 3 is a flow chart illustrating a layout design method according to some example embodiments of the inventive concept. FIGS. 4A to 4C illustrate placement and routing of a standard cell layout, and are plan views illustrating a standard cell layout according to some embodiments of the inventive concept.

Referring to FIGS. 3 and 4A, an original standard cell layout may be configured using a layout design tool (S122).

The standard cell layout may include a layout of a lower wiring layer on a logic (or a device layer) layout including logic transistors. FIG. 4A schematically illustrates a layout of a lower wiring layer on a logic layout.

For convenience of explanation, the logic layout is schematically illustrated as layout patterns defining first and second active regions AR1 and AR2. However, the first and second active regions AR1 and AR2 may be understood in some embodiments to constitute a P-MOSFET and an N-MOSFET, respectively, with gate electrodes (not shown). The first and second active regions extend in a first direction D1, and may be separated from each other in a second direction D2.

The layout of the lower wiring layer is schematically illustrated as first and second lower wiring patterns M1$a$ and M1$b$ connected to first and second active regions AR1 and AR2, respectively. Each of the first and second lower wiring patterns M1a and M1b may be an input wiring pattern connected to a gate electrode (not shown) of logic transistors. Each of the first and second lower wiring patterns M1a and M1b may have a line shape that extends in the first direction D1, and the first and second lower wiring patterns may be spaced apart from each other in the second direction D2. Each of the first and second lower wiring patterns M1a and M1b may include two patterns separated in the first direction D1.

In another example embodiment (see FIG. 7), the layout of the lower wiring layer extends in the first direction D1 on the substrate, and may further include an additional lower wiring pattern spaced apart from the first and second lower wiring patterns M1a and M1b in the second direction D2. The additional lower wiring pattern may be located between the first and second lower wiring patterns M1a and M1b, and may be an output pattern connected to a source/drain region.

Each of the first and second lower wiring patterns M1a and M1b may include pin regions P11, P12, P21, and P22 for routing with layouts of an upper wiring layer, which is described hereafter. For example, each of the first and second lower wiring patterns M1a and M1b may have two pin regions P11, P12, P21, and P22. In an example embodiment, all of the pin regions P11, P12, P21, or P22 are available pin regions, but only a portion is selected in a routing process and may be provided as a region in which an upper via is to be formed.

In an example embodiment, all of the pin regions P11, P12, P21, or P22 are available pin regions, but one pin region of the two pin regions P11, P12, P21, or P22, which overlap in the second direction D2, may be specified in advance. For example, as illustrated in FIG. 4A, two pin regions P11, P12, P21, and P22 may include a predesignated pin region AP, predesignated as a via position, and an unavailable pin region DP, which is not used as a via position.

The layouts of the standard cell described above may be stored in the cell library described above with reference to FIG. 2. The standard cell layouts, stored in the cell library, may be placed (S124).

In FIG. 4A, a single standard cell layout is illustrated. However, the standard cell layout may be provided as a plurality of standard cell layouts and the plurality of standard cell layouts may be placed in parallel in the first direction D1 and/or the second direction D2.

Routing a layout of an upper wiring layer may be performed (S126) on the placed standard cell layout.

In this process, the routing may be a design process by programming as illustrated in FIG. 2, and may not implemented as an entity element using a semiconductor process. However, a routing result of a design process is illustrated in FIGS. 4B and 4C for purposes of illustration.

Referring to FIG. 4B, the layout of the upper wiring layer may include placement of first and second upper wiring patterns M2a and M2b as well as placement of first and second upper vias V1a and V1b.

Each of the first and second upper wiring patterns M2a and M2b may have a line shape that extends in the second direction D2, and the first and second upper wiring patterns may be spaced apart from each other in the first direction D1. Each of the first and second upper vias V1a and V1b may be placed in a predesignated single region of a plurality of pin regions overlapping in the second direction D2, in which the first and second upper wiring patterns M2a and M2b extend, that is, predesignated pin regions AP.

As illustrated in FIG. 4B, the first upper vias V1a are located in a predesignated pin regions AP of pin regions P11 and P12 of the first lower wiring pattern M1a, and may connect to a first upper wiring pattern M2a, which overlap the pin regions AP and extend in the second direction. In a similar manner, the second upper vias V1b are located in predesignated pin regions AP of pin regions P21 and P22 of the second lower wiring pattern M1b, and may be connected to a second upper wiring pattern M2b, which overlap the pin regions AP and extend in the second direction. As described above, in a standard cell layout according to an example embodiment, an upper wiring layer may be connected to the lower wiring layer through the first and second upper vias V1a and V1b.

In the routing of the standard cell layout described with reference to FIGS. 4A and 4B, among a plurality of pin regions P11, P12, P21, or P22, one pin region is defined in advance in the first direction D1 for connection with first and second upper wiring patterns M2a and M2b. Thus, the runtime of a complex routing design process may not only be reduced, but scaling at the block level may also be improved.

The layout of the upper wiring layer may be extended through additional design for connection with another wiring (for example, output wiring related to a source/drain) and/or connection with another standard cell layout, in addition to the first and second upper wiring patterns M2a and M2b.

As illustrated in FIG. 4C, a portion M2b' of the first and second upper wiring patterns may have an extended portion M_E, or an additional upper wiring pattern M2c may be placed in the layout. For example, the additional upper wiring pattern M2c may be provided as wiring for connection with another adjacent standard cell. The additional upper wiring pattern M2c may be connected to another standard cell, and may not be connected to the first and second lower wiring patterns M1a and M1b.

For the additional design, placement may be performed simultaneously with, in concert with, or after placement of the first and second upper vias V1a and V1b as well as the first and second upper wiring patterns M2a and M2b.

The above-described series of processes of FIG. 3 may be implemented using a layout design tool and/or a place and routing tool. In an example embodiment, although a layout of an upper wiring layer is illustrated as a single layer, the layout may be provided as a plurality of layers and the layers may be stacked sequentially.

As described above, a layout design may be performed to implement a semiconductor integrated circuit on a silicon substrate. For example, the layout design may include a routing procedure of placing and connecting various cells provided in a cell library according to a defined design rule.

In an example embodiment, pin regions to be connected to upper wiring patterns M2a and M2b are defined to pin regions P11, P12, P21, or P22, overlapping in one direction (for example, D2) one by one using a cell library, so the routing design may be simplified in an integrated complex cell. This may be advantageous when a distance between the first and second lower wiring patterns M1a and M1b is relatively small. In some embodiments, a distance between the first and second lower wiring patterns may be equal to or less than 100 nm. When the lower wiring layer further includes the additional lower wiring pattern, the first and second lower wiring patterns M1a and M1b and the additional lower wiring pattern may be arranged at a pitch of 30 nm or less in the second direction.

Example embodiments are described above by way of a schematic illustration of a transistor. However, a semiconductor device according to some example embodiments of the inventive concept will be described hereafter with reference to drawings illustrating a layout of a device layer including transistors in various forms.

Figure 5:
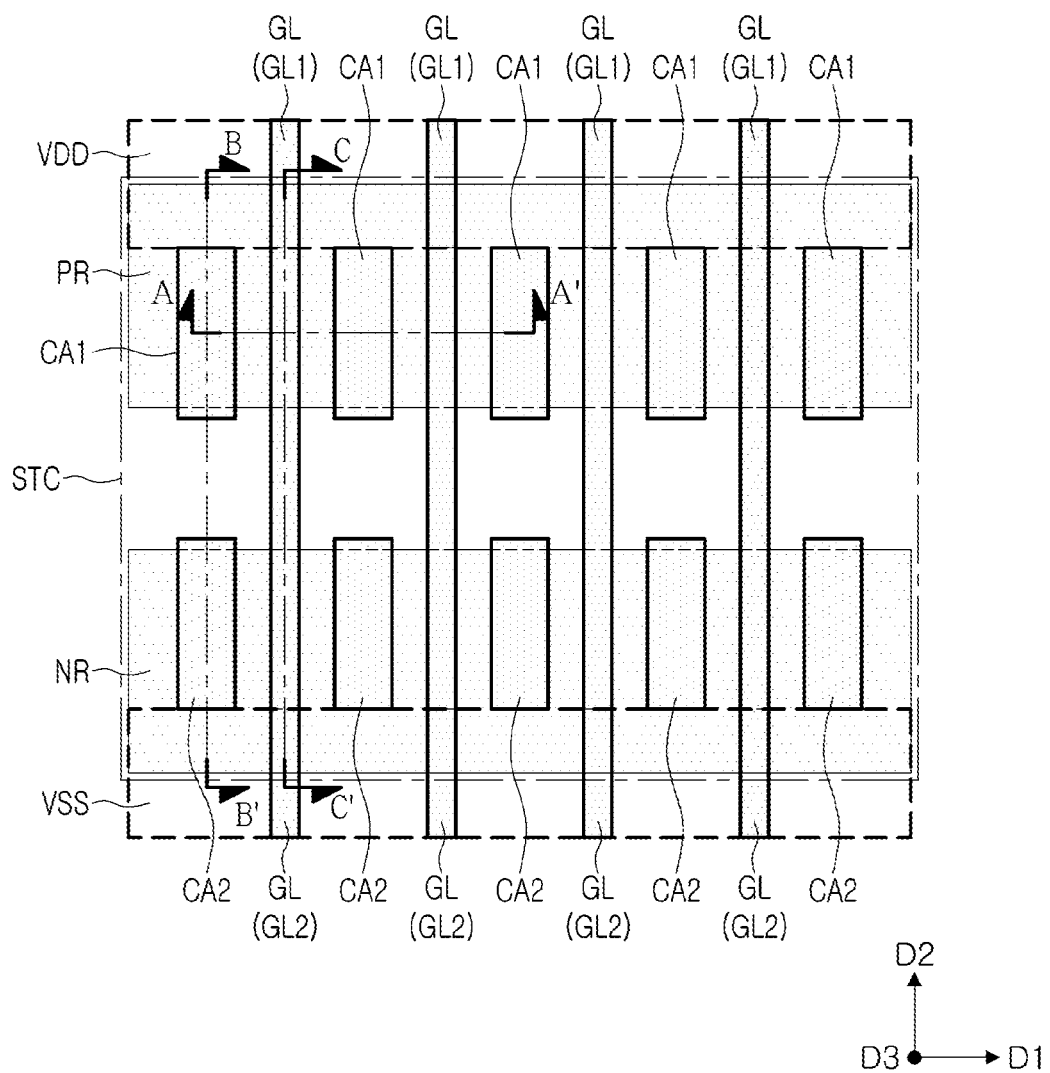
FIG. 5 is a layout illustrating a standard cell according to some example embodiments of the inventive concept.
Figure 6A:
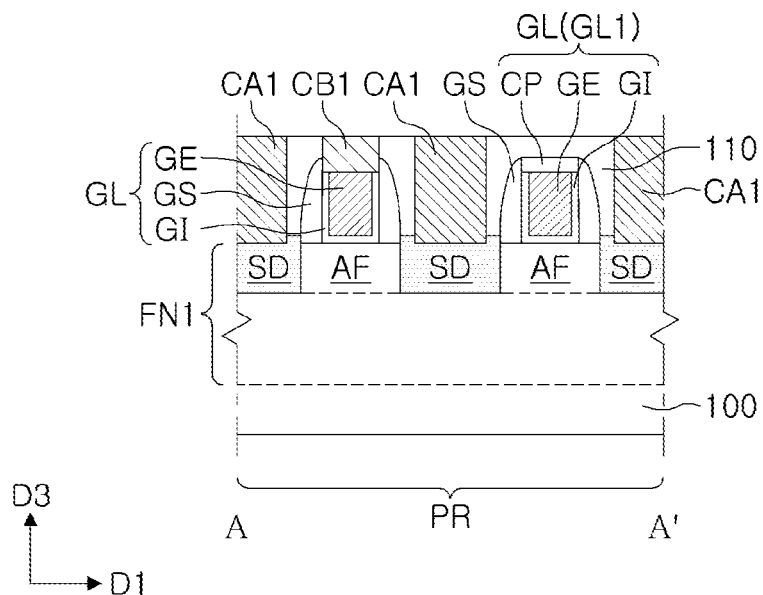
FIGS. 6A to 6C are cross-sectional views taken along lines A-A', B-B', and C-C' of the standard cell of FIG. 5.
Figure 6B:
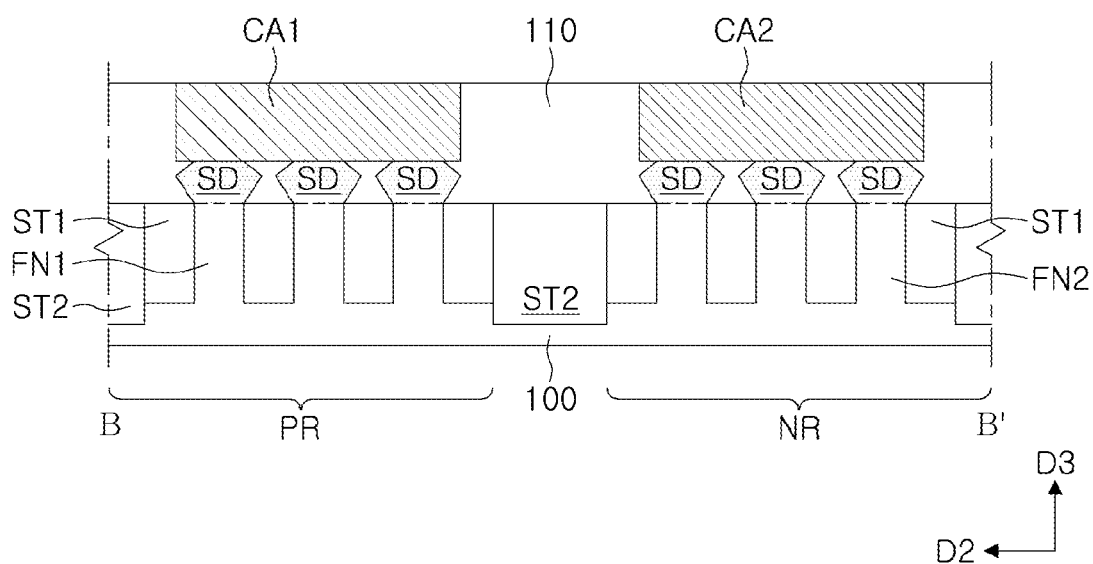
Figure 6C:
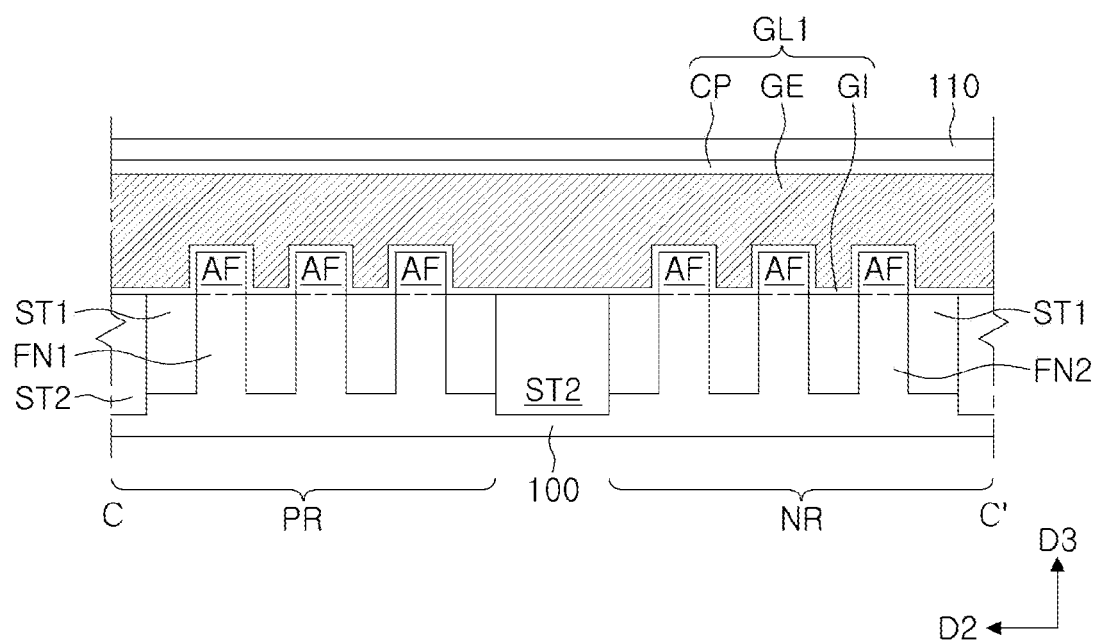

FIG. 5 is a layout illustrating a standard cell according to some example embodiments of the inventive concept, and FIGS. 6A to 6C are cross-sectional views taken along lines A-A', B-B', and C-C' of the standard cell of FIG. 5.

The standard cell, illustrated in FIG. 5, may be an example of a standard cell layout composed of a three-dimensional transistor, such as a FINFET, in a semiconductor device implemented on a semiconductor substrate 100 through a process (S150) of manufacturing a semiconductor device using the photolithography process described in FIG. 2.

Referring to FIG. 5 and FIGS. 6A to 6C, a standard cell may include first and second active patterns, each extending in a first direction D1 on the substrate 100. For example, the substrate 100 may be a silicon substrate or germanium substrate, or a silicon on insulator (SOI) substrate. Each of the first and second active patterns FN1 and FN2 may include three active fins, but, in other embodiments, may be provided as one active fin or a plurality of active fins.

First device isolation patterns ST1 may be formed on the substrate 100 separating the first and second active patterns FN1 and FN2 while filling a gap therebetween. The first device isolation patterns ST1 may be recessed to expose upper portions of the first and second active patterns FN1 and FN2 (i.e., at least a portion of the upper portions of the first and second active patterns FN1 and FN2 may be free of the first device isolation patterns ST1). A second device isolation pattern ST2 may be formed on the substrate 100 defining a P-MOSFET region PR and an N-MOSFET region NR. For example, the P-MOSFET region PR may be defined by the first active patterns FN1, while the N-MOSFET region NR may be defined by the second active patterns FN2.

The first and second device isolation patterns ST1 and ST2 may be formed using an insulating material, such as silicon oxide. As an example, the first device isolation patterns ST1 may be formed to have a depth shallower than the second device isolation pattern ST2. In these embodiments, the first device isolation patterns ST1 may be formed by a separate process from that of the second device isolation pattern ST2. The first device isolation patterns ST1 may be formed using a shallow trench isolation (STI) process, while the second device isolation pattern ST2 may be formed using a deep trench isolation (DTI) process.

Gate lines GL may be formed, intersecting the first and second active patterns FN1 and FN2 and extending in the second direction D2. The gate lines GL may be spaced apart from each other in the first direction D1. As illustrated in FIG. 6A, each of the gate lines GL may include a gate electrode GE extending in the second direction D2, a gate insulating pattern GI below the gate electrode GE, and gate spacers GS provided in both sides of the gate electrode GE. Further, in each of the gate lines GL, a capping pattern CP on and at least partially covering an upper surface of the gate electrode GE may be formed.

For example, the gate electrodes GE may include one or more materials including, but not limited to, a doped semiconductor, a metal, and/or conductive metal nitride. The gate insulating pattern GI may include a silicon oxide film or a silicon oxynitride film, or include a high dielectric film having a dielectric constant higher than that of the silicon oxide film. Each of the capping pattern CP and the gate spacers GS may include one or more materials including, but not limited to, a silicon oxide film, a silicon nitride film, and/or a silicon oxynitride film.

The source/drain regions SD may be formed in the first and second active patterns FN1 and FN2 located on both sides of each of the gate electrodes GE. The source/drain regions SD, on the P-MOSFET region PR, may be doped with p-type impurities, while the source/drain regions SD, on the N-MOSFET region NR, may be doped with n-type impurities.

The source/drain regions SD may include a selective epitaxial regrowth layer. A portion of the first and second active patterns FN1 and FN2 in both sides of the gate electrodes GE is recessed, and then, an epitaxial regrowth process may be performed on recessed regions of the first and second active patterns FN1 and FN2. The epitaxial regrowth process may be performed using a semiconductor element different from the substrate 100. As an example, the source/drain regions SD may be formed as a semiconductor element having a lattice constant greater or less than a lattice constant of a semiconductor element of the substrate 100. The source/drain regions SD are formed of a semiconductor element different from the substrate 100, so compressive stress or tensile stress may be provided to channel regions AF between the source/drain regions SD.

An interlayer insulating film 110 on and at least partially covering the source/drain regions SD and the gate lines GL may be formed. The interlayer insulating film 110 may be formed of a silicon oxide film or silicon oxynitride film. The first and second contact structures CA1 and CA2 may be formed on source/drain regions SD of the P-MOSFET region PR and the N-MOSFET region NR, respectively.

The first and second contact structures CA1 and CA2 may have a line or a bar extending in the second direction D2. In a subsequent design process, the lower wiring layer M1 may include first and second power wiring patterns VDD and VSS together with first and second lower wiring patterns, and the first and second power wiring patterns VDD and VSS may extend in the first direction D1 along a boundary of the standard cell. In addition, a portion of the first and second contact structures CA1 and CA2 may extend to be connected to the first and second power wiring patterns VDD and VSS. Such embodiments will be described with reference to FIG. 5.

A portion of each of the first and second contact structures CA1 and CA2 may be located on the second device isolation pattern ST2 adjacent to the P-MOSFET region PR or the N-MOSFET region NR. Upper surfaces of the first and second contact structures CA1 and CA2 may be coplanar with an upper surface of the interlayer insulating film 110.

The interlayer insulating film 110 is patterned to form holes exposing at least a portion of the source/drain regions SD, and then, the holes are at least partially filled with a conductive material CN to form the first and second contact structures CA1 and CA2. In a process of forming holes exposing the source/drain regions SD (forming portions of the source/drain regions SD that are free of the interlayer insulating film 110), upper portions of the source/drain regions SD may be removed. The first and second contact structures CA1 and CA2 may include one or more materials including, but not limited to, a doped semiconductor, a conductive metal nitride, a metal, and/or metal silicide. In a similar manner, the interlayer insulating film 110 is patterned to form holes exposing the gate electrode GE (i.e., at least a portion of the gate electrode GE is free of the interlayer insulating film 110), and then, the holes are at least partially filled with a conductive material CN to form a gate contact structure CB.

Figure 7:
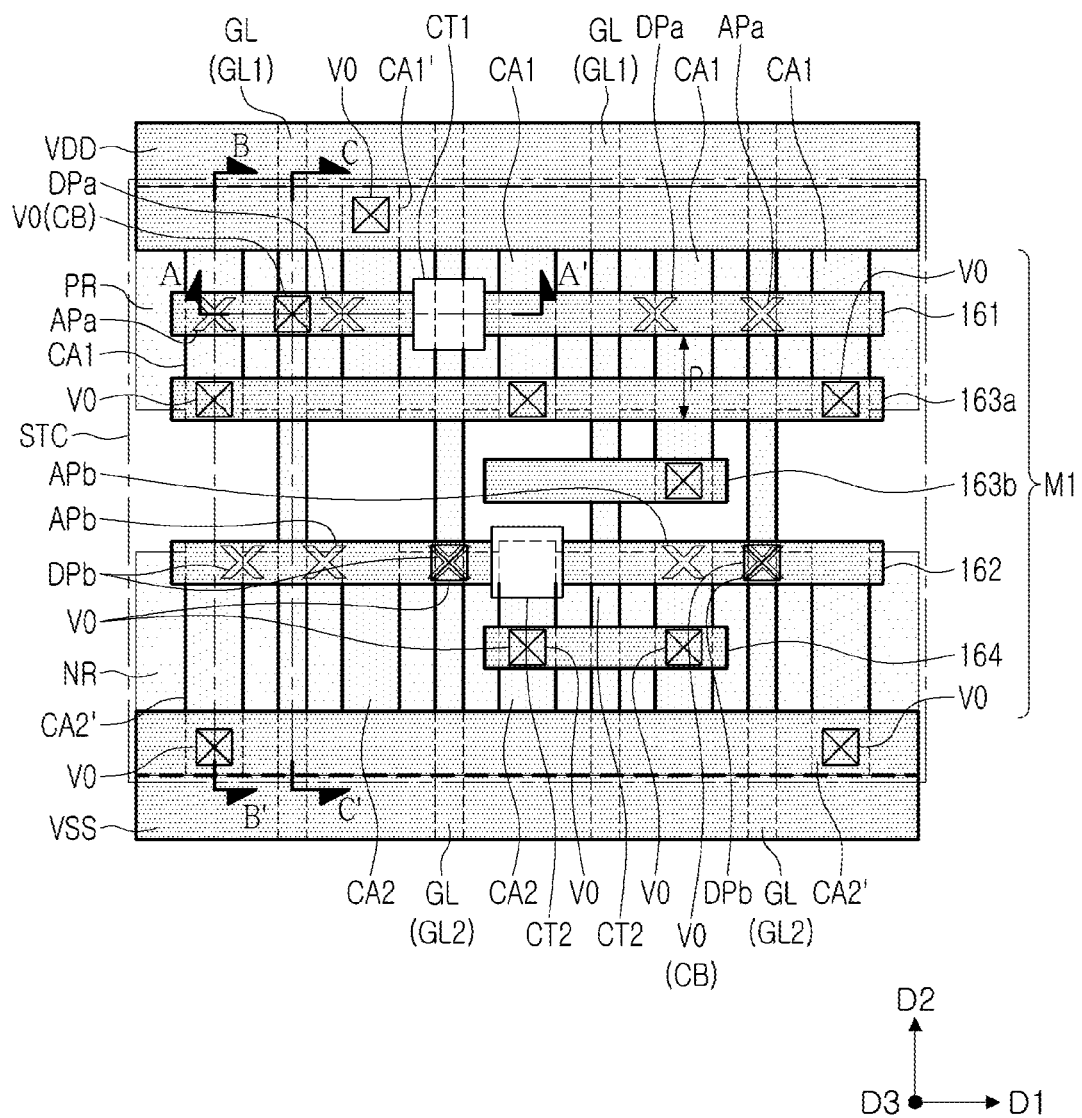
FIG. 7 is a layout illustrating a lower wiring layer design of a semiconductor device according to some example embodiments of the inventive concept.
Figure 8A:
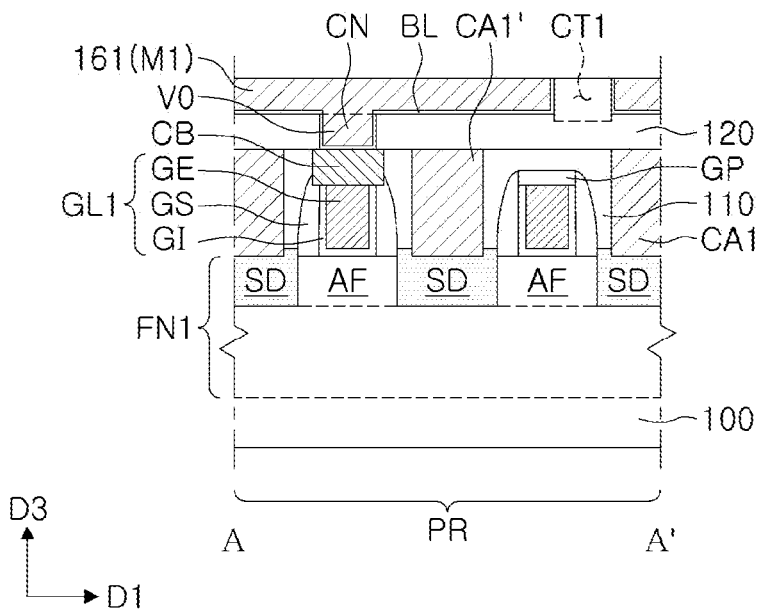
FIGS. 8A to 8C are cross-sectional views taken along lines A-A', B-B', and C-C' of the semiconductor device of FIG. 7.
Figure 8B:
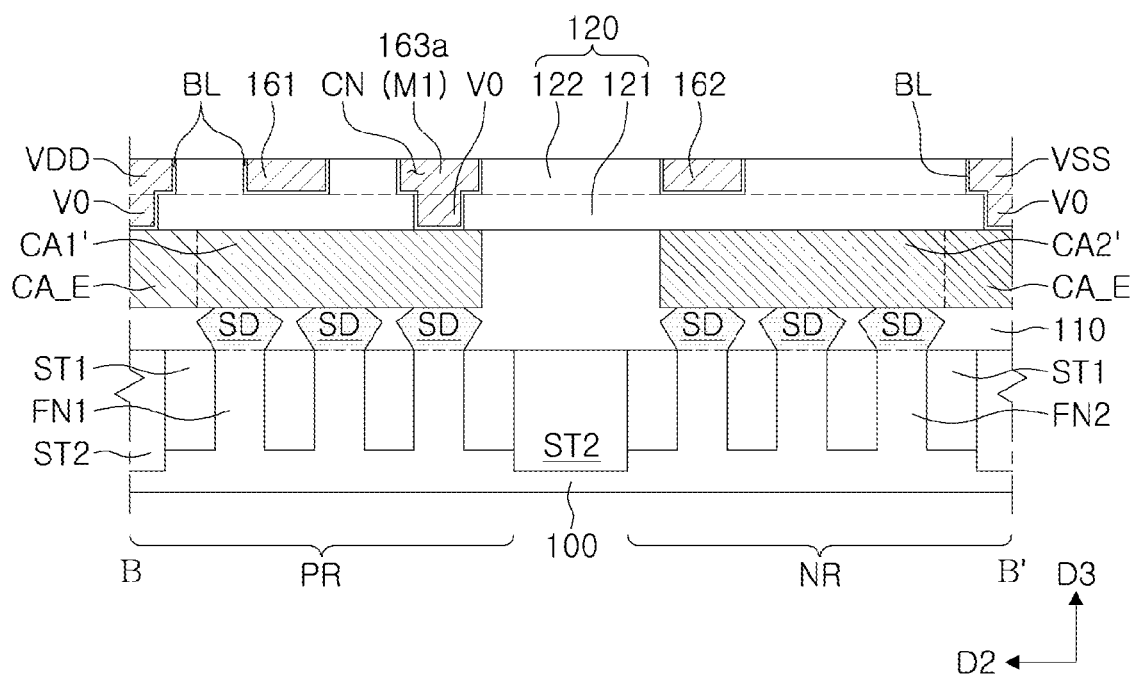
Figure 8C:
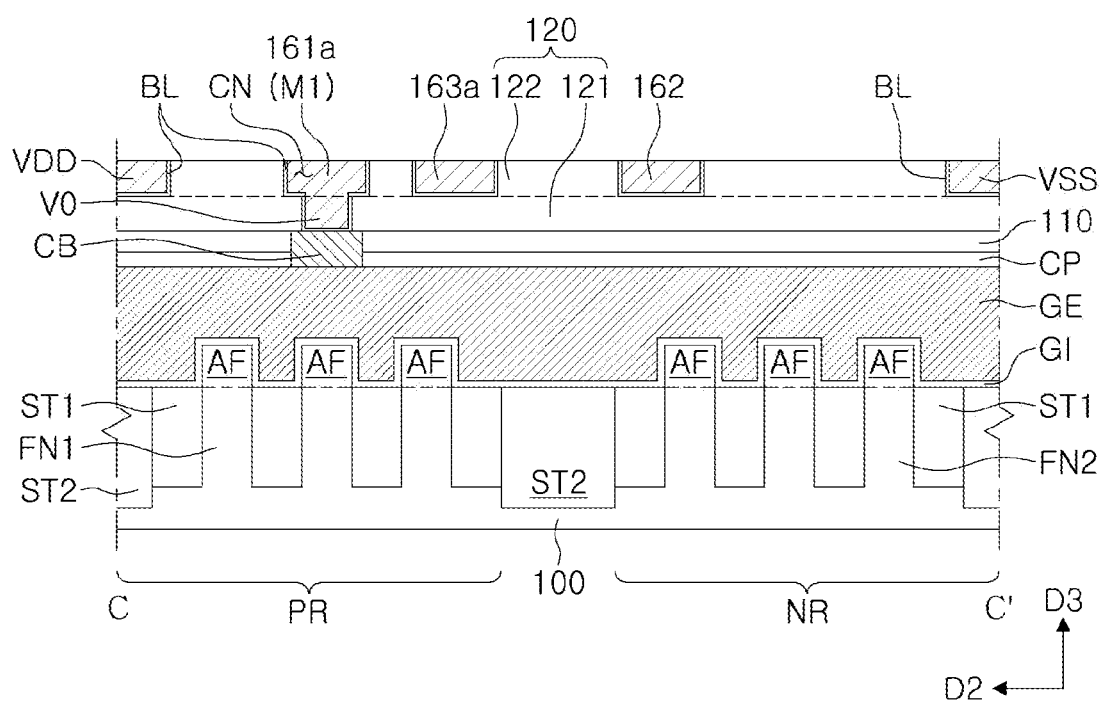

FIG. 7 is a layout illustrating a semiconductor device according to some example embodiments of the inventive concept, and FIGS. 8A to 8C are cross-sectional views taken along lines A-A', B-B', and C-C' of the semiconductor device of FIG. 7. FIG. 7 illustrates a layout of a lower wiring layer M1 according to some example embodiments, while FIGS. 8A to 8C illustrate a structure of a lower wiring layer M1 formed in a process performed according to the layout.

Referring to FIG. 7, the first and second power wiring patterns VDD and VSS are placed at a boundary of an adjacent standard cell, that is, outside the P-MOSFET region PR and outside the N-MOSFET region NR, and extend in the first direction D1. A portion of the first and second contact structures CA1 and CA2 extends to be connected to the first and second power wiring patterns VDD and VSS. A single active contact structure CA1', of first contact structures CAL has an extended portion CA_E below a first power wiring pattern VDD, and may be connected by a lower via V0 located in the extended portion CA_E. Two active contact structures CA2', located at both ends of the second contact structures CA2, have an extended portion CA_E below a second power wiring pattern VSS, and may be connected by lower vias V0 located in the extended portion CA_E. In this regard, a drain voltage Vdd, that is, a power voltage, may be applied from the first power wiring pattern VDD to the P-MOSFET region PR, while a source voltage Vss, that is, a ground voltage, may be applied from the second power wiring pattern VSS to the N-MOSFET region NR.

Referring to FIGS. 8A to 8C together with FIG. 7, a first dielectric film 120 may be formed on the interlayer insulating film 110. For example, the first dielectric film 120 may include a silicon oxide film and/or silicon oxynitride film.

A lower wiring layer M1 may be formed in the first dielectric film 120. The lower wiring layer M1 may include first to fourth lower wiring patterns 161, 162, 163a, 163b, 164, which extend in the first direction D1, as well as lower vias V0, connected to the first to fourth lower wiring patterns 161, 162, 163a, 163b, and 164, respectively.

Each of the first and second lower wiring patterns 161 and 162 may be connected to gate electrodes GE of the first and second gate lines GL1 and GL2 through the lower via V0 and a gate contact structure CB (see FIG. 8A). Each of the first and second lower wiring patterns 161 and 162 may be an input wiring pattern connected to each of the gate electrodes GE. In an example embodiment, the first and second lower wiring patterns 161 and 162 may include dielectric separation patterns CT1 and CT2 separating into two lower wiring patterns in the first direction D1.

The third lower wiring patterns 163a and 163b may be connected to the source/drain regions SD of the first active pattern FN1 through the lower via V0 and the first contact structure CA1, while the fourth lower wiring pattern 164 may be connected to the source/drain regions SD of the second active pattern FN2 through the lower via V0 and the second contact structure CA2 (see FIGS. 8B and 8C). Each of the third and fourth lower wiring patterns 163a, 163b, and 164 may be an output wiring pattern connected to each of the source/drain regions SD. In an example embodiment, the third lower wiring pattern may include two lower wiring patterns 163a and 163b, placed between the first and second lower wiring patterns 161 and 162. If necessary, other lower wiring patterns 161, 162, and 164 may also be provided as a plurality of lower wiring patterns.

As illustrated in FIG. 7, in the first and second lower wiring patterns 161 and 162 connected to the gate electrodes GE, pin regions AP and DP may be provided as a plurality of pin regions, and the plurality of pin regions may be connected to an upper wiring layer. Pin regions AP and DP may define in advance pins to be used through a cell library. A single pin region of two pin regions overlapping in the second direction D2 may be defined in advance, and a position of a via for connection with an upper wiring layer may be formed in the predesignated pin regions AP. As a result, the remaining pin regions may be an unavailable pin region DP, which is not used as a via position. In FIG. 7, it is illustrated that some pin regions are specified, and the specified pin regions are indicated as predesignated pin regions AP. However, if upper wiring patterns (171 and 172 of FIG. 9), to be connected to the first and second lower wiring patterns 161 and 162, satisfies a condition in which the upper wiring patterns are only connected to a single pin region among a plurality of pin regions overlapping in the second direction D2, other pin regions may be selected as predesignated pin regions AP.

The routing design of the upper wiring layer (M2 of FIG. 9), using the predesignation described above, may be advantageously applied to a complex standard cell. For example, it may be advantageously applied to embodiments in which the first to fourth lower wiring patterns 161, 162, 163a, 163b, and 164 are densely arranged. For example, a pitch P of the first to fourth lower wiring patterns 161, 162, 163a, 163b, and 164 may be equal to or less than 30 nm. In some embodiments, a distance between the first and second lower wiring patterns 161 and 162 may be equal to or less than 100 nm.

Referring to FIGS. 8A to 8C, the first dielectric film 120 may include a first insulating film 121 and a second insulating film 122. For example, the lower wiring layer M1 may be formed through a dual damascene process in the first dielectric film 120.

The lower wiring layer M1 may include a conductive material CN, and a barrier film BL placed between the conductive material CN and the first dielectric film 120. The barrier film BL may be directly on and at least partially cover side walls and a bottom surface of the conductive material CN except for an upper surface of the conductive material CN. For example, the conductive material CN may include one or more materials including, but not limited to, a conductive metal nitride and/or a metal. The barrier film BL may include a metal nitride, for example, TiN. Upper surfaces of the conductive material CN may be coplanar with an upper surface of the first dielectric film 120.

Figure 9:
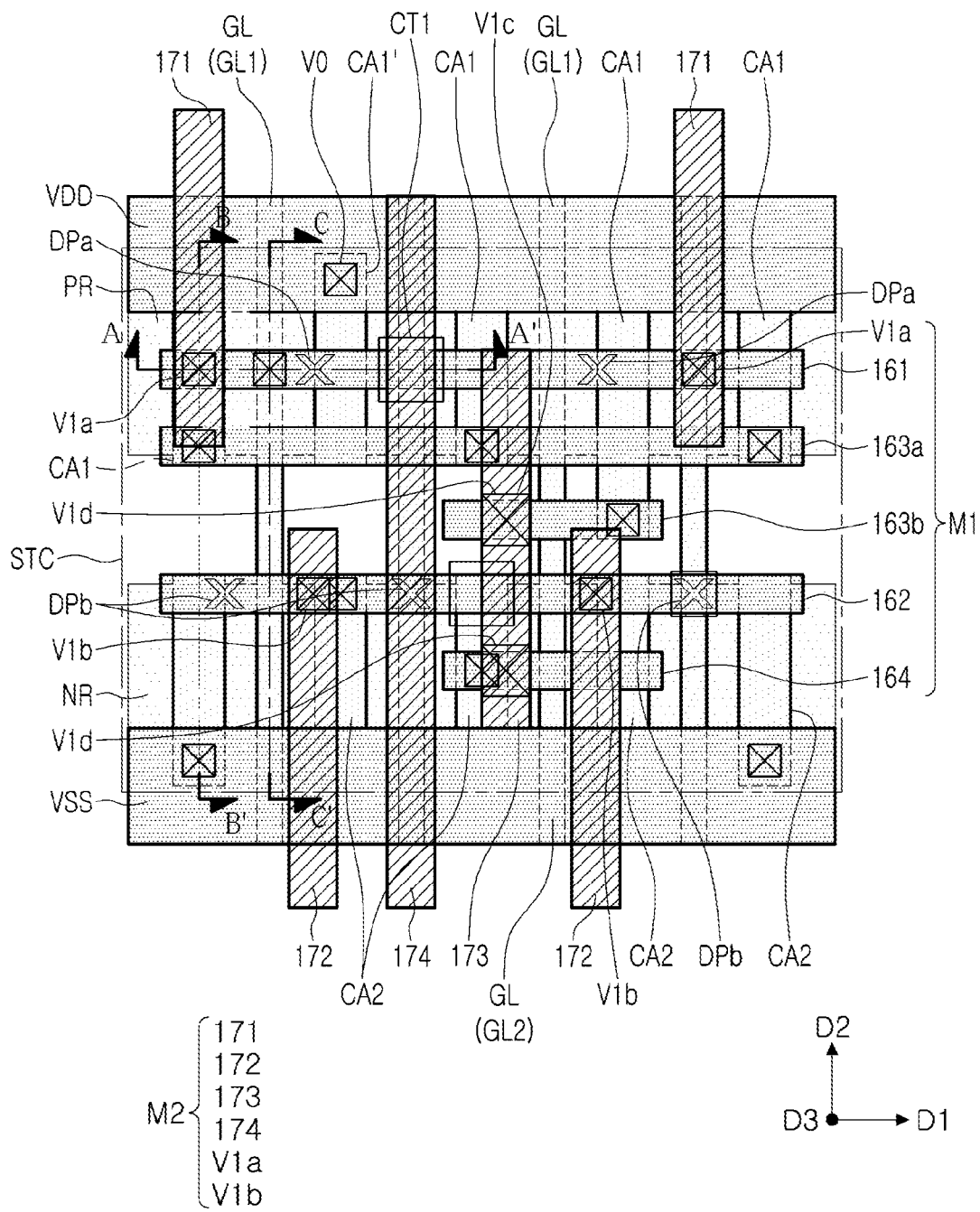
FIG. 9 is a layout illustrating an upper wiring layer design of a semiconductor device according to some example embodiments of the inventive concept.
Figure 10A:
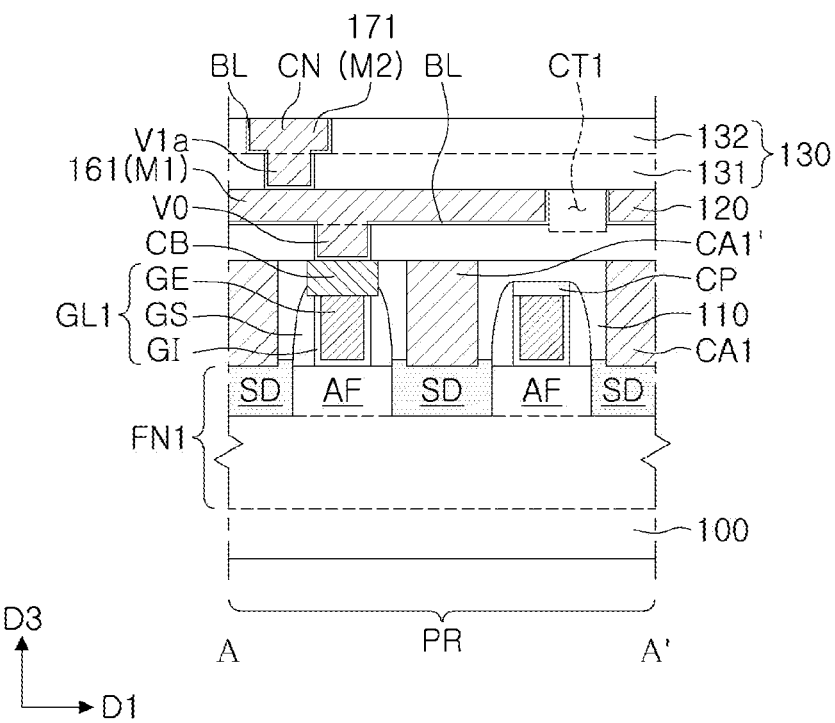
FIGS. 10A to 10C are cross-sectional views taken along lines A-A' and B-B', and C-C' of the semiconductor device of FIG. 9.
Figure 10B:
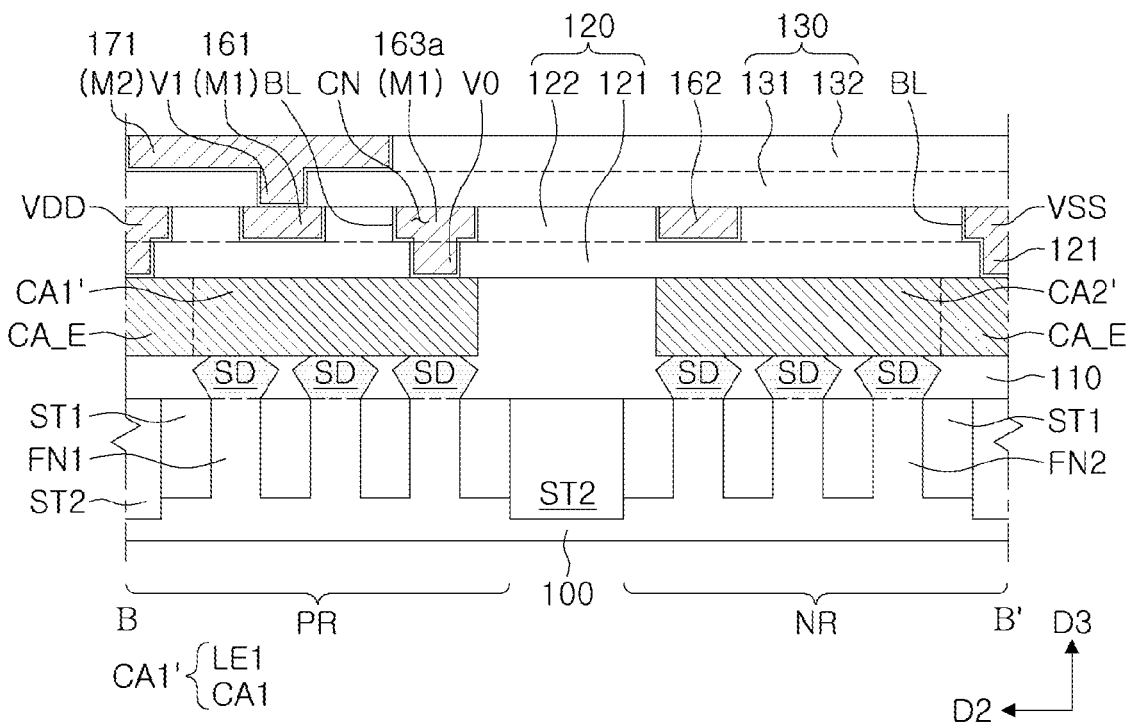
Figure 10C:
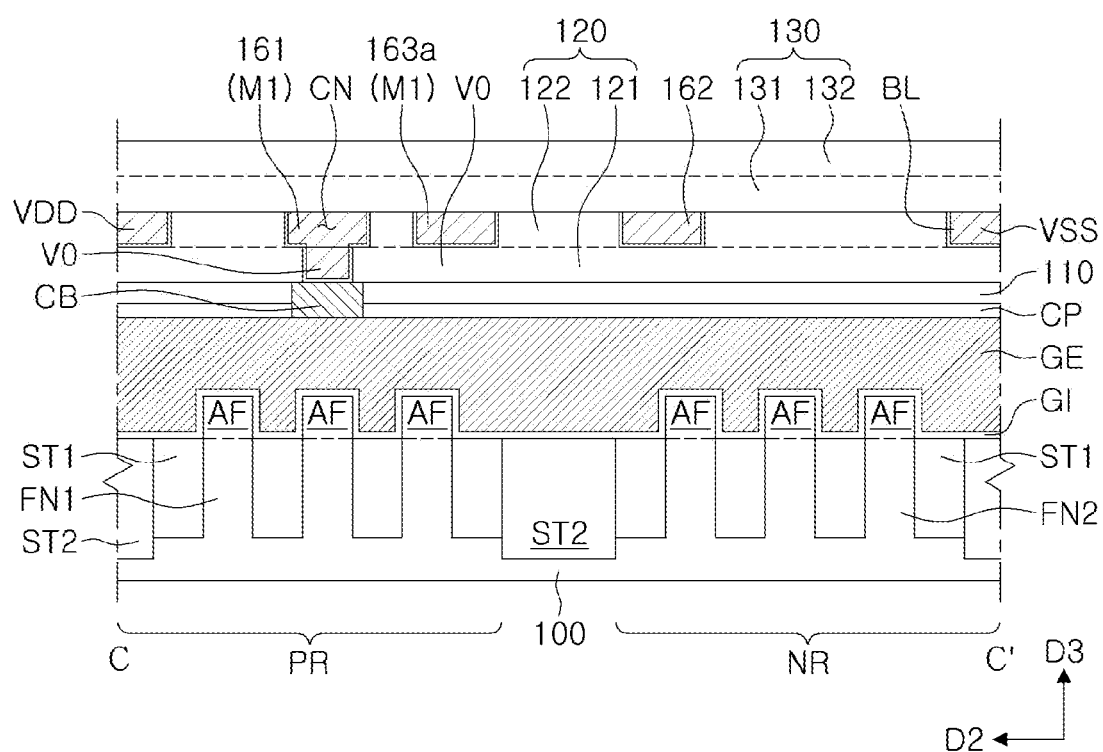

FIG. 9 is a layout illustrating a semiconductor device according to some example embodiments of the inventive concept, while FIGS. 10A to 10C are cross-sectional views taken along lines A-A', B-B', and C-C' of the semiconductor device of FIG. 9. FIG. 9 illustrates a layout of an upper wiring layer M2 according to some example embodiments, while FIGS. 10A to 10C illustrate a structure of an upper wiring layer M2 formed in process performed according to the layout.

Referring to FIGS. 10A to 10C together with FIG. 9, a second dielectric film 130 may be formed on the first dielectric film 120. For example, the second dielectric film 130 may include a silicon oxide film and/or silicon oxynitride film in a manner similar to the first dielectric film 120.

An upper wiring layer M2, connected to the lower wiring layer M1, may be formed in the second dielectric film 130. The upper wiring layer M2 may include first to fourth upper wiring patterns 171, 172, 173, and 174, which extend in the second direction D2, as well as upper vias V1, connected to the first to fourth upper wiring patterns 171, 172, 173, and 174.

The first and second upper wiring patterns 171 and 172 may be designed to pass a single predesignated pin region AP, of a plurality of pin regions, which overlap in the second direction D2, and may be connected to first and second lower wiring patterns 161 and 162, respectively, through the upper via V1.

The first upper wiring patterns 171 may be connected to predesignated pin regions (APa of FIG. 8) of the first lower wiring patterns 161, respectively, through the first upper via V1a (see FIGS. 10A and 10B). In a similar manner, the second upper wiring patterns 172 may be connected to predesignated pin regions (APb of FIG. 8) of the second lower wiring patterns 162, respectively, through the second upper via V1b.

As described above, the first and second upper wiring patterns 171 and 172 may form an input wiring structure connected to the gate electrodes GE together with the first and second lower wiring patterns 161 and 162. The design of the upper wiring layer M2 so as to form an input wiring structure may be performed using the predesignated pin regions APa and APb.

The third upper wiring pattern 173 may be connected to the third lower wiring pattern 163b and a fourth lower wiring pattern 164 through a third upper via V1c. The third upper wiring pattern 173 may form an output wiring structure connected to source/drains SD together with the third and fourth lower wiring patterns 163b and 164.

The fourth upper wiring pattern 174 may not be connected to the first and second lower wiring patterns. The fourth upper wiring pattern 174 may extend over the standard cell of FIG. 9 for connection to other adjacent standard cells. In some embodiments, all of the fourth upper wiring pattern 174 may not be connected to the third and fourth lower wiring patterns 163a, 163b, and 164.

In an example embodiment, in the first and second lower wiring patterns 161 and 162 connected to the gate electrodes GE, pin regions may be connected to the upper wiring layer M2 and may be provided as a plurality of pin regions. But the in regions to be used may be defined in advance using a cell library, so routing design of an upper wiring layer may be simplified. Referring to FIG. 9 together with FIG. 7, one pin region APa and APb is defined in advance among two pin regions APa and DPb as well as APb and DPa, overlapping in one direction (for example, D2), and a position of the first and second upper vias V1a and V1b for connection with the upper wiring layer M2 may be selected in the predesignated pin regions APa and APb.

The second dielectric film 130 may include a first insulating film 131 and a second insulating film 132 in a manner similar to the first dielectric film 120. For example, the upper wiring layer M2 may be formed through a dual damascene process in the second dielectric film 130 in a manner similar to the lower wiring layer M1. The upper wiring layer M2 may include a conductive material CN and a barrier film BL placed between the conductive material CN and the first dielectric film 120.

In an example embodiment, a layout of the upper wiring layer M2 is described as a single layer, but the layout thereof may be provided as a plurality of wiring layers. The plurality of wiring layers may be stacked sequentially on the upper wiring layer M2 in a process the same as or similar to a formation process of the lower and upper wiring layers M1 and M2.

Figure 11:
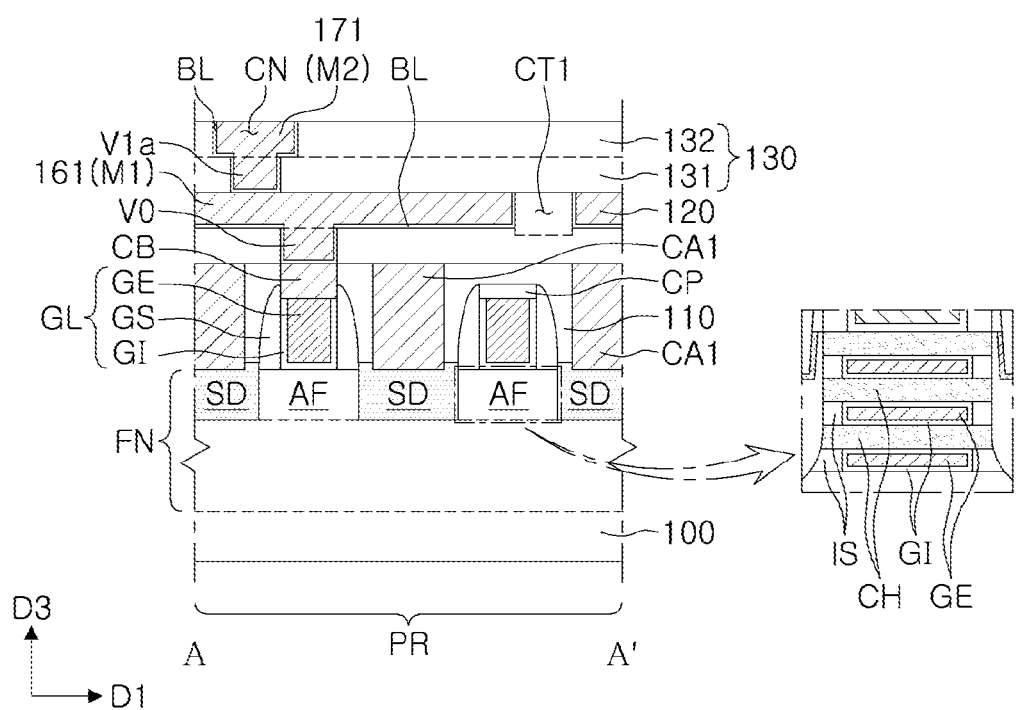
FIG. 11 is a cross-sectional view of a semiconductor device according to some example embodiments of the inventive concept.

The routing design method of a semiconductor device according to some example embodiments may be advantageously applied to various types of semiconductor devices. For example, it may also be advantageously applied to a semiconductor device including a transistor (e.g., MBCFET®) provided with a nanosheet, and/or a different type of a three dimensional semiconductor device. FIG. 11 is a cross-sectional view illustrating a semiconductor device provided with a transistor equipped with a nanosheet according to some embodiments of the inventive concept.

Referring to FIG. 11, a semiconductor device according to some example embodiments may include a transistor (e.g., MBCFET®) provided with a nanosheet. An active pattern FN of the semiconductor device may be understood to be similar to the semiconductor device illustrated in FIGS. 10A to 10C except that it is implemented as a multi-channel structure using a nanosheet. Moreover, components of an example embodiment semiconductor device including a nanosheet may be understood with reference to the descriptions of components the same as or similar to those of the semiconductor device illustrated in FIGS. 10A and 10C unless specifically stated otherwise.

As illustrated in FIG. 11, a semiconductor device may include a plurality of channel layers CH having a nanosheet structure and spaced apart from each other in a direction D3 perpendicular to an upper surface of the substrate 100, and a gate electrode GE extending in a second direction (D2) intersecting the first direction D1 while bordering the plurality of channel layers CH. As described above, the gate electrode GE, used in an example embodiment, may be formed to be interposed not only between gate insulating films GI but also between a plurality of channel layers CH.

The semiconductor device may include source/drain regions SD disposed in the active region FN located in each of both sides of the gate electrode GE and connected to the plurality of channel layers CH. In an example embodiment, the source/drain regions SD are disposed in the active region FN located in each of both sides of the gate electrode GE, and may be connected to each of both sides in the first direction D1 of the plurality of channel layers CH.

In an example embodiment, three channel layers CH are described, by way of example, but the number of channel layers is not particularly limited. The channel layers CH may be formed of semiconductor patterns. For example, the semiconductor patterns may include one or more materials including, but not limited to, silicon (Si), silicon Germanium (SiGe), and/or germanium (Ge). The source/drain regions SD may include an epitaxial layer formed using the plurality of channel layers CH and the active region AR as a seed. For example, the source/drain regions SD may include one or more materials including, but not limited to, silicon germanium (SiGe), silicon (Si), and/or silicon carbide (SiC).

Internal spacers IS may be provided between each of the source/drain regions SD and the gate electrode GE. The internal spacers IS may be provided on one side of the gate electrode GE. The internal spacers IS and the channel layers CH may be alternately located in the direction perpendicular to the upper surface of the substrate 100. Each of the source/drain regions SD may be in physical contact with the channel layers CH, and may be spaced apart from the gate electrode GE with the internal spacers IS interposed therebetween. The gate dielectric film GI is interposed between the gate electrode GE and each of the channel layers CH, and may extend between the gate electrode GE and each of the internal spacers IS.

In a semiconductor device according to an example embodiment, in a manner similar to the example embodiment described above (see FIGS. 7 and 9), first and second lower wiring patterns 161 and 162 are connected to the gate electrodes GE, and pins to be used using a cell library are defined in advance among a plurality of available pin regions located in the first and second lower wiring patterns 161 and 162. In detail, referring to FIGS. 7 and 9, one pin region APa and APb is defined in advance among two pin regions APa and DPb as well as APb and DPa, overlapping in one direction (for example, D2), and a position of the first and second upper vias V1a and V1b for connection with the upper wiring layer M2 may be selected in the predesignated pin regions APa and APb. Thus, in a complex standard cell, routing design of the upper wiring layer M2 may be performed more efficiently.

As set forth above, according to example embodiments of the present inventive concept, to design a wiring layer with improved efficiency, complicated by integration of semiconductor devices, a position of a signal input via may be set in advance in a routing cell library, that is, a position of an upper via connected to a gate electrode may be set in advance in a lower wiring pattern. Therefore, the runtime of a routing process may not only reduced, but an area at a block level may also be reduced.

While example embodiments have been shown and described above, it will be apparent to those skilled in the art that modifications and variations could be made without departing from the scope of the present disclosure, as defined by the appended claims.

What is claimed is:

1. A semiconductor device, comprising:
   a device layer including first and second active patterns, extending in a first direction on a substrate and adjacent to each other, and a plurality of gate electrodes extending in a second direction, intersecting the first direction, on the substrate and crossing the first and second active patterns;
   a lower wiring layer on the device layer, and including first and second lower wiring patterns extending in the first direction, located on the first and second active patterns, respectively, and connected to the plurality of gate electrodes;
   an additional lower wiring pattern extending in the first direction on the substrate, and spaced apart from the first and second lower wiring patterns in the second direction; and
   an upper wiring layer on the lower wiring layer, and having first and second upper vias on the first and second lower wiring patterns, respectively, and first and second upper wiring patterns extending in the second direction,
   wherein the first upper wiring pattern is connected to the first upper via without being connected to the second upper via,
   wherein the second upper wiring pattern is connected to the second upper via without being connected to the first upper via,
   wherein the device layer further includes source/drain regions on both sides of each of the plurality of gate electrodes in the first and second active patterns, and
   wherein the additional lower wiring pattern includes a third lower wiring pattern connected to the source/drain regions of the first active pattern, and a fourth lower wiring pattern connected to the source/drain regions of the second active pattern.

2. The semiconductor device of claim 1, wherein a distance between the first and second lower wiring patterns is equal to or less than 100 nm.

3. The semiconductor device of claim 1, wherein the lower wiring layer further includes a first lower via connecting a first portion of the plurality of gate electrodes to the first lower wiring pattern, and a second lower via connecting a second portion of the plurality of gate electrodes to the second lower wiring pattern.

4. The semiconductor device of claim 1, wherein the first and second lower wiring patterns and the additional lower wiring pattern are arranged at a pitch of 30 nm or less in the second direction.

5. The semiconductor device of claim 1, wherein the lower wiring layer further includes third and fourth lower vias connecting the source/drain regions to the third and fourth lower wiring patterns, respectively.

6. The semiconductor device of claim 1, further comprising:
   a third upper wiring pattern connected to the third and fourth lower wiring patterns,
   wherein the upper wiring layer further includes third and fourth upper vias connecting the third upper wiring pattern to the third and fourth lower wiring patterns, respectively.

7. The semiconductor device of claim 1, further comprising:
   a fourth upper wiring pattern connected to a portion of the first and second lower wiring patterns,
   wherein the portion of the first and second lower wiring patterns does not include all of the first and second lower wiring patterns.

8. The semiconductor device of claim 1, wherein at least one of the first and second upper wiring patterns extends to cross all of the first and second lower wiring patterns.

9. The semiconductor device of claim 1, wherein at least one of the first and second lower wiring patterns includes a dielectric separation pattern configured to separate the at least one of the first and second lower wiring patterns into two lower wiring patterns in the first direction.

10. A semiconductor device, comprising:
    first and second active patterns extending in a first direction on a substrate and adjacent to each other;
    a plurality of first and second gate electrodes crossing the first and second active patterns and extending in a second direction, intersecting the first direction;
    an interlayer insulating film on the first and second active patterns and the plurality of first and second gate electrodes;
    first and second lower wiring patterns extending in the first direction on the interlayer insulating film, each being connected to the plurality of first and second gate electrodes;
    a third lower wiring pattern extending in the first direction between the first and second lower wiring patterns;
    a dielectric film on the interlayer insulating film and the first and second lower wiring patterns;
    a plurality of first and second upper vias in the dielectric film and connected to the first and second lower wiring patterns, respectively;
    a plurality of first upper wiring patterns extending in the first direction on the dielectric film, each of the plurality of first upper wiring patterns being connected to the plurality of first upper vias without being connected to the plurality of second upper vias; and
    a plurality of second upper wiring patterns extending in the second direction on the dielectric film, each of the plurality of second upper wiring patterns being connected to the plurality of second upper vias without being connected to the plurality of first upper vias,
    wherein the first and second lower wiring patterns and the additional lower wiring pattern are arranged at a pitch of 30 nm or less in the second direction.

11. The semiconductor device of claim 10, further comprising:
a plurality of first lower vias in the interlayer insulating film and connecting the first lower wiring pattern to the plurality of first gate electrodes, and a plurality of second lower vias in the interlayer insulating film and connecting the second lower wiring pattern to the plurality of second gate electrodes.

12. The semiconductor device of claim 10, wherein each of the first and second lower wiring patterns includes a dielectric separation pattern configured to separate the respective one of the first and second lower wiring patterns into two lower wiring patterns in the first direction.

13. The semiconductor device of claim 10, wherein each of the plurality of first and second gate electrodes includes two gate electrodes, and
wherein the first lower wiring patterns are connected to a first pair of the first and the second gate electrodes, and the second lower wiring pattern is connected to a second pair of the first and the second gate electrodes.

14. A semiconductor device, comprising:
a plurality of cells on a substrate,
wherein at least one cell of the plurality of cells includes:
first and second active patterns having different conductivity types and extending in a first direction;
a plurality of gate electrodes crossing the first and second active patterns and extending in a second direction, intersecting the first direction;
first and second lower wiring patterns on the plurality of gate electrodes and configured to apply an electrical signal to the plurality of gate electrodes;
first and second upper vias on the first and second lower metal wirings and connected to the first and second lower wiring patterns, respectively; and
a plurality of upper wiring patterns on the first and second lower metal wirings,
wherein the plurality of upper wiring patterns include input wiring patterns connected to a first one of the first and second upper vias without being connected to a second one of the first and second upper vias,
wherein each of a first one of the plurality gate electrodes and a second one of the plurality of gate electrodes includes two gate electrodes, and
wherein the first lower wiring patterns are connected to a first pair of the first and the second one of the plurality of gate electrodes, and the second lower wiring pattern is connected to a second pair of the first and the second one of the plurality of gate electrodes.

15. The semiconductor device of claim 14, further comprising:
first and second source/drain regions on both sides of each of the plurality of gate electrodes in the first and second active pattern.

16. The semiconductor device of claim 15, further comprising:
third and fourth lower wiring patterns configured to output an electrical signal from the first and second source/drain regions.

17. The semiconductor device of claim 16, wherein the plurality of upper wiring patterns include output wiring patterns connected to each of the third and fourth lower wiring patterns.

* * * * *